United States Patent [19]

Walker

[11] Patent Number: 4,664,938
[45] Date of Patent: May 12, 1987

[54] METHOD FOR DEPOSITION OF SILICON

[75] Inventor: Starnes E. Walker, Bartlesville, Okla.

[73] Assignee: Phillips Petroleum Company, Bartlesville, Okla.

[21] Appl. No.: 731,232

[22] Filed: May 6, 1985

[51] Int. Cl.$^4$ .............................................. B05D 3/06
[52] U.S. Cl. ............................................ 427/39; 55/2; 55/12; 118/723; 250/281; 250/283
[58] Field of Search ................ 427/38, 39; 118/723; 55/2, 12; 250/281, 283

[56] References Cited

U.S. PATENT DOCUMENTS

| | | | |
|---|---|---|---|
| 2,897,126 | 7/1959 | George | 204/130 |
| 3,536,522 | 10/1970 | Cecil | 117/106 |
| 3,668,382 | 6/1972 | Cohen | 250/41.9 |
| 4,059,461 | 11/1977 | Fan et al. | 148/1.5 |
| 4,085,332 | 4/1978 | Fletcher et al. | 250/528 |
| 4,146,449 | 3/1979 | Clark et al. | 204/157.1 |
| 4,256,404 | 3/1981 | Walker | 356/316 |
| 4,260,649 | 4/1981 | Dension et al. | 427/53.1 |
| 4,317,844 | 3/1982 | Carlson | 427/39 |
| 4,466,992 | 8/1984 | Preiling | 427/39 |

OTHER PUBLICATIONS

Zewail, H. Ahmed. "Laser Selective Chemistry—Is It Possible?", *Physics Today*, (Nov. 1980), pp. 27–33.
Hartford, Jr., Allen et al., "Laser Purification of Silane: Impurity Reduction to the Sub-Part-Per-Million Level," *J. Appl. Phys.*, 51(8), (Aug. 1980), pp. 4471–4474.
Zare, N. Richard, "Laser Separation of Isotopes," *Scientific American*, (Feb. 1977), pp. 86–98.
Perrin, J. et al., "Positive and Negative Ions in Silane and Disilane Multipole Discharges," *International Journal of Mass Spectrometry and Ion Processes*, 57 (1984), pp. 249–281.
Hartford, Jr., Allen et al., "Laser Purification of Silane," Los Alamos Scientific Laboratory, Progress Report-period ending Jun., 1980, pp. 1–12.
Hartford, Jr., Allen et al., "Laser Purification of Materials," University of California, Los Alamos Scientific Laboratory, pp. 1–21.

*Primary Examiner*—Bernard D. Pianalto
*Attorney, Agent, or Firm*—William R. Sharp

[57] ABSTRACT

An apparatus and method are provided for depositing silicon on a substrate in a deposition chamber wherein deposition of impurities can be effectively prevented. Impurities are ionized according to the invention to form impurity ions which are collected so as to prevent their deposition on the substrate.

6 Claims, 1 Drawing Figure

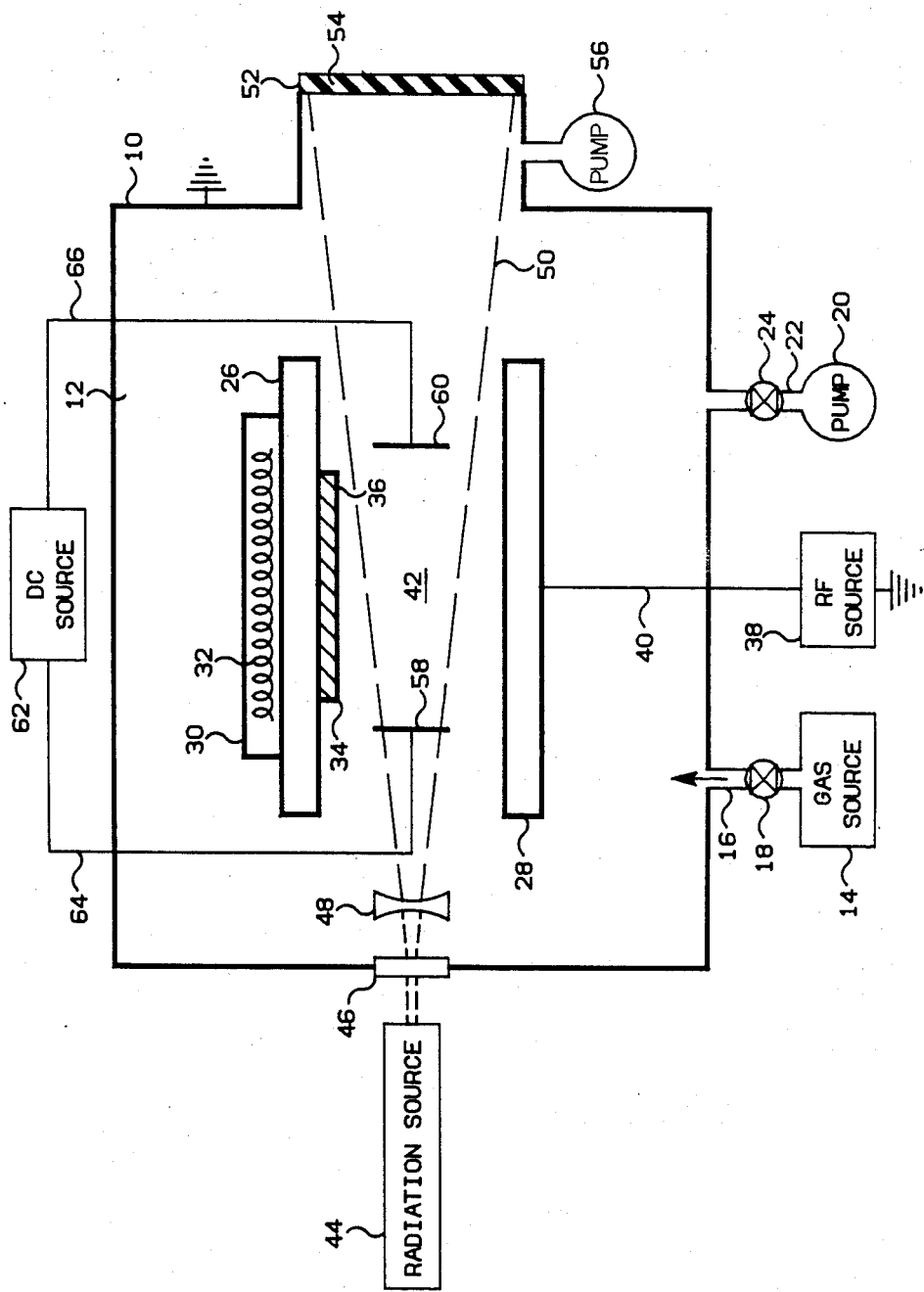

METHOD FOR DEPOSITION OF SILICON

BACKGROUND OF THE INVENTION

This invention relates to an apparatus for depositing silicon on a substrate. In another aspect, the invention relates to a method for depositing silicon.

The deposition of a thin film of silicon onto a substrate has commercial and industrial significance. One commercially important application of silicon deposition is in the manufacture of photovoltaic cells for the conversion of sunlight into electrical energy. Such photovoltaic cells are typically manufactured by depositing three silicon layers onto the substrate. These layers include a p-doped layer, an n-doped layer and an intrinsic (undoped) layer sandwiched between the two doped layers. In operation, light (photons) is absorbed by the intrinsic layer which creates electron-hole pairs in the intrinsic layer. An electric field is generated between the doped layers which causes the electrons and holes to migrate in opposite directions, thereby producing an electrical potential difference across the cell.

Each of the silicon layers mentioned above are typically deposited onto the substrate by the decomposition of silane ($SiH_4$). Products of this decomposition include amorphous silicon and silicon hydride (SiH) which are allowed to deposit on the substrate in a suitable deposition chamber. Examples of presently used vapor deposition techniques for depositing silicon onto a substrate include chemical vapor deposition, ion deposition and radio frequency glow discharge deposition. In the radio frequency glow discharge method, a mixture of silane gas and inert gas such as argon is passed into an evacuated chamber containing the substrate. The silane is decomposed at an elevated temperature by a radio frequency plasma discharge. The doped layers are deposited by mixing in n-type dopants, such as hydrides of As, P and Sb, or p-type dopants, such as hydrides of B, Al and Ga, with the silane.

In all of the silicon vapor deposition techniques, various impurities may exist in the deposition chamber which can undesirably affect electronic or optical properties of the deposited silicon when such impurities deposit on the substrate in uncombined form or in compound with the silicon. For example, impurities in the intrinsic layer can change its band structure so as to reduce the magnitude of the electric field generated within the finished solar cell. Consequently, electron and hole migration between the doped layers is undesirably affected. Impurities in the intrinsic silicon layer of a solar cell can also act as recombination centers for the recombination of electrons and holes which were produced from photon absorption. Thus, as electron-hole pairs are lost, lower voltage and power output of the cell result.

With respect to specific impurities, metallic impurities in elemental form can be present in an RF glow discharge chamber. Such metallic impurities can be produced anywhere metal surfaces (i.e. chamber walls and electrodes) within the chamber contact the hot plasma. Plasma contact can cause chemical sputtering and surface vaporization that will allow atoms of the metal to be removed and introduced into the plasma. In addition, n and p-type dopants can be especially pernicious impurities in the deposition of an intrinsic silicon layer. Commercially available silane, which is introduced into the deposition chamber, typically contains dopants such as $PH_3$ and $AsH_3$ at the ppm level, and substantially lower levels of $B_2H_6$.

One process directed toward reducing the level of impurities in deposited silicon involves the removal of dopant impurities such as $AsH_3$, $PH_3$ and $B_2H_6$ from silane feedstock before it is introduced to the deposition chamber. According to this process, silane gas is irradiated with ultraviolet radiation of a wavelength in the range of 190 nm to 202 nm. The above-mentioned dopant impurities are thought to be dissociated by the radiation to form neutral products. The net result is the formation of solid, polymeric deposits on the wall of the reaction vessel.

SUMMARY OF THE INVENTION

It is, therefore, an object of the present invention to provide an apparatus and method for depositing silicon which is relatively free of impurities.

It is also an object of the invention to provide an apparatus and method for depositing silicon on a substrate in a deposition chamber, wherein impurities within the chamber are effectively collected so as to prevent their deposition on the substrate.

The above objects are realized in a silicon deposition apparatus and method of the type wherein gaseous silane is decomposed in a chamber to the decomposition products of silicon and SiH which are deposited on the substrate, the chamber containing impurities other than the silane gas and its decomposition products. At least one of the impurities is ionized in the chamber to form impurity ions. These ions are collected to prevent their deposition on the substrate.

According to a preferred embodiment, a source is provided to direct a beam of electromagnetic radiation into the chamber so as to photoionize impurities therein. In addition, collection electrodes are provided for collecting the impurity ions, wherein a DC voltage is applied to the electrodes.

The present invention enables effective prevention of various impurities in the deposition chamber from being deposited with silicon on the substrate. This is in sharp contrast to the above described prior art process which does not address the problem of removing impurities which exist within the deposition chamber itself.

BRIEF DESCRIPTION OF THE DRAWING

The FIGURE is a schematic sectional view of an apparatus according to one embodiment of the invention.

DETAILED DESCRIPTION OF THE INVENTION

An embodiment of the present invention as applied to a radio frequency glow discharge silicon vapor deposition apparatus will now be described with reference to the FIGURE, the FIGURE being only a schematic representation with various details and supporting structures omitted for the sake of clarity. The illustrated apparatus can be used to make solar cells, as discussed above, or it could also be employed to make semiconductor devices which use silicon films.

Referring now to the FIGURE, the illustrated apparatus includes a shell 10, preferably constructed of a suitably strong and conductive material such as stainless steel. As shown, shell 10 defines a chamber 12 therein. A gas source 14 is provided for introducing a silane containing gas into chamber 12, gas source 14 being suitably connected to the shell by conduit 16. A valve 18 is preferably included along conduit 16 for regulating gas flow into the chamber. A vacuum pump 20 is connected to shell 10 through conduit 22 and valve 24. Pump 20 is most preferably a diffusion pump which serves to effectively evacuate chamber 12 before introducing gas from source 14 into chamber 12, but it is anticipated that a mechanical pump may evacuate the system adequately.

Mounted within chamber 12 are two electrodes 26 and 28. Each electrode is made of a metallic material having a good electrical conductivity such as steel or platinum. Electrodes 26 and 28 are shown as being in the form of plates, although other configurations such as a screen type construction can be employed.

A heating plate 30 is mounted to the upper surface of electrode 26, and preferably consists of a ceramic frame which encloses a heating coil 32 which may be energized from a current source (not shown) external to chamber 12. Also associated with electrode 26 is a substrate 34 which is secured to the lower surface of electrode 26 by a suitable means, not shown. Thus, substrate 34 is mounted so that silicon may be deposited on its lower surface 36. Mounting substrate 34 on the upper electrode in this manner insures a more uniform silicon film and less settling of heavy materials on the deposition surface. Suitable substrate materials include stainless steel, titanium and glass coated with a conductive transparent oxide like indium-tin oxide.

An RF source 38 is connected via lead wire 40 to electrode 28. The other terminal of RF source 38 is grounded to shell 10 as shown so that electrode 26 is coupled to the ground terminal of RF source 38 via the gas filled space between it and shell 10. Alternatively, electrode 26 could be connected directly to ground. Most preferably, RF source 38 is connected to electrode 28 through a capacitor (not shown) which functions to block any DC components. Such blocking of DC components insures that no net electric field will exist between electrodes 26 and 28. The absence of a net electric field is desirable in this type of device for several reasons, one of which is the prevention of fringing along edges of the electrodes.

With respect to frequency, RF source 38 is preferably capable of supplying an alternating current to electrodes 26 and 28 at a frequency of about 27 MHz. Such a frequency is low enough to enable the use of conventional coaxial cable rather than hollow waveguides for signal transmission. Frequencies below the radio frequency spectrum range can be employed if desired, but are generally less desirable since the size of chamber 12 must be increased to an impractical size in order to establish resonance and to effectively couple electromagnetic energy into the chamber without reflection. It should also be kept in mind that in the radio frequency spectrum, certain guidelines set by the Federal Communication Commission must be adhered to in selection of frequency.

As is known in the art, chamber 12 and the separation of electrodes 26 and 28 must be dimensioned such that a resonant cavity exists in which a standing wave is created. Gas breakdown occurs in a reaction zone between electrodes 26 and 28 shown generally at 42. A hot plasma exists in this reaction zone which can cause sputtering at the metallic surfaces of the electrodes. Therefore, dimensions are preferably set so that the reaction zone and the hot plasma are kept away from these metallic surfaces as much as possible.

Radiation source 44 is preferably a low pressure gas discharge lamp utilizing krypton or helium, for example. These types of lamps are sometimes referred to as "flash tubes". Such lamps are capable of generating a beam of electromagnetic radiation having a wavelength in the vacuum ultraviolet region of the spectrum, such a capability being needed to ionize impurities as will be more apparent below. Although a gas discharge lamp is the preferred radiation source, other sources capable of operating in the vacuum ultraviolet region (i.e. about 110 nm to about 180 nm) of the spectrum could be employed. One example of such an alternate radiation source is an electron synchrotron radiation source, such as an electron synchrotron, wherein high energy electrons are subjected to a centripetal acceleration so as to emit electromagnetic radiation. The use of a laser (i.e. of the excimer type) is also possible. Lasers operating in this region of the electromagnetic spectrum, however, are generally in the experimental stage.

A window 46, preferably of quartz, is mounted to shell 10, and is positioned to receive the beam from radiation source 44 therethrough. A lens system, schematically indicated at 48, is positioned in chamber 12 to receive the beam as transmitted by window 46. Lens system 48 preferably causes the beam to diverge so as to cover reaction zone 42 to the maximum extent possible. This beam passes between electrodes 26 and 28, and is schematically indicated at 50.

A beam trap or "dump" 52 is preferably provided on the side of shell 10 opposite window 26 to receive beam 50 after it has passed through reaction zone 42. Beam trap 52 comprises an outwardly extending section of the shell having a suitable radiation absorbing block 54, made of carbon for example, mounted therein. As shown, a pump 56 is connected to the interior of trap 52 for removing vapors which may form within the trap due to intense heat created by the absorbed beam.

Two additional electrodes, 58 and 60, are mounted within chamber 12 for collecting impurity ions produced by the beam of radiation. As shown, electrodes 58 and 60 are spaced from one another, and are positioned between electrodes 26 and 28. Electrodes 58 and 60 are constructed of a conductive material such as aluminum or steel, and can be in the form of plates or screens. A screen like construction is preferred, however, since this permits radiation to pass through the electrodes, thus allowing a maximum area of reaction zone 42 to receive radiation.

A DC power source 62 is provided for supplying an electrical voltage to the electrodes 58 and 60 via leads 64 and 66. The polarity of each electrode is not shown since this is not critical to device operation. Each of electrodes 58 or 60 may be either positive or negative. Thus, an electric field is generated by electrodes 58 and 60 which tends to attract ions of a certain polarity to the electrode of opposite polarity.

Operation of the illustrated apparatus will now be described. First, pump 20 is activated and valve 24 opened in order to evacuate chamber 12 to a pressure of about $10^{-3}$ to about $10^{-6}$ torr. Substrate 34 is heated to a temperature in the range of about 150° to about 300° C., most preferably about 200° C., by energizing the heating coil 32.

A mixture of a gaseous silane ($SiH_4$) and an inert gas, such as argon, is bled into the chamber 12 from gas source 14 to a pressure of about 0.1 to about 0.5 torr. Most typically, the volume ratio of the silane gas to inert gas is about 1:10. Of course, if a p or n-doped layer is being deposited, a minor amount, generally about 1%, of a suitable doping agent is added to the gaseous stream. As noted above, in the case of intrinsic layer deposition, no dopant is introduced into the chamber. Dopants are considered a pernicious impurity in the gas stream in intrinsic layer deposition.

To initiate the glow discharge between the electrodes 26 and 28, the RF source 38 is energized. Decomposition of the silane gas results. Decomposition products include silicon and SiH which deposit as a thin amorphous film on surface 36 of substrate 34. Hydrogen in the deposited silicon film is desirable because of advantageous electronic properties resulting therefrom. Most typically, the deposition process occurs in less than one minute, the exact time depending on desired thickness of the film, chamber pressure, and other factors.

During the deposition of the silicon film on substrate 34, radiation source 44 is activated so as to transmit beam 50 through reaction zone 42, and DC source 62 is energized such that an electric field is generated between electrodes 58 and 60. Electrodes 58 and 60, and radiation source 44, cooperate to prevent impurities from being deposited on substrate 36 in a manner discussed in detail below.

Radiation source 44 is appropriately adjusted to generate a beam of radiation having a wavelength which will ionize selected impurities in chamber 12 so as to produce impurity ions. The wavelength to achieve ionization of a preselected impurity should correspond to a photon energy greater than the ionization potential for the impurity. The photon energy corresponding to the ionization potential of a selected impurity is herein denoted as the threshold energy. The wavelength corresponding to this threshold energy can be determined from Planck's law, $E = hc/\lambda$, where $c$ is the speed of light, h is Planck's constant and $\lambda$ is wavelength. This relation is most usually given in terms of frequency $\nu$ wherein $E = h\nu$.

Ionization potentials and corresponding wavelengths determined in this manner are set forth in the table below for several impurities typically found in the deposition chamber. Ionization potential values given were obtained from *CRC Handbook of Chemistry and Physics*, 55th edition, 1974–1975. Ionization potentials for Cr and Ni are first (i.e. lowest) ionization potentials.

| Impurity | Ionization Potential (eV) | Wavelength (nm) |
|---|---|---|
| $AsH_3$ | 10.3 | 120 |
| $PH_3$ | 9.98 | 124 |
| Cr | 6.76 | 184 |
| Ni | 7.63 | 163 |

As previously noted, $AsH_3$ and $PH_3$ are impurities commonly found in commercially available silane gas, whereas Cr and Ni are metallic impurities which can result from plasma sputtering at steel alloy surfaces within the deposition chamber.

To ionize one of the above impurities, a wavelength is employed which is less than the given wavelength. Preferably, the selected wavelength is greater than the wavelength (about 107 nm) corresponding to the ionization potential for silane (about 11.6 eV) in order to avoid ionization of the silane. Reference may be made to an article entitled "Positive and Negative Ions in Silane and Disilane Multipole Discharges" by J. Perrin et al, *International Journal of Mass Spectrometry and Ion Processes*, No. 57 (1984), p. 263, for a discussion of the ionization potential of silane.

Of course, the wavelength selected could provide photon energies sufficient to ionize several impurities. Some selectivity in ionizing impurities in the illustrated embodiment is possible, however, particularly if the selected impurity has a relatively low ionization potential. For substantially all impurities found in the deposition chamber, the wavelength of the radiation is generally in the range of about 110 nm to about 180 nm.

If desired, a trial run could be made without the use of radiation source 44 for the purpose of identifying impurities in chamber 12. For example, a deposited silicon film could be analyzed by any appropriate analysis technique, such as secondary ion mass spectrometry (SIMS), to identify impurities in the silicon film.

The intensity of beam 50 is preferably in the range of about $10^{14}$ to about $10^{17}$ photons/second. Maintaining an intensity in this range will generally be more than sufficient to ionize a substantial portion of the impurity molecules and/or atoms in the volume occupied by beam 50.

With respect to molecular impurities such as $AsH_3$, it should be understood that although a substantial portion of the impurity molecules will be ionized by photons in beam 50, a small portion of these molecules will be dissociated. In other words, at photon energies discussed above, ionization and dissociation are competing processes to some extent in the case of molecules. With respect to atomic impurities such as Cr, substantially all atoms excited by beam photons will be ionized. For a detailed discussion of the photoionization phenomenon, reference may be made to *Photoionization Processes in Gases* by Geoffrey V. Marr. Academic Press, New York (1967).

Preferably, a voltage of about 10 to about 100 volts is applied to electrodes 58 and 60. An electric field is generated between electrodes 58 and 60 accordingly. Thus, impurity ions, which are positively charged due to the loss of an electron, are attached to and collected by the negative electrode so as to prevent their deposition on the substrate. It should be apparent that some difficulties could arise in an alternative deposition arrangement, such as a DC discharge device, which does not use a neutral beam since some silicon containing ions desired to be deposited on the substrate could be collected by the collection electrodes instead.

Thus, there is provided by the present invention an effective means of preventing the deposition of impurities on a substrate in a silicon vapor deposition system. In addition to impurities found in the silane gas, other impurities typically found in the deposition chamber can be effectively collected according to the invention.

Obviously, many modifications of the invention are possible in light of the above teachings. For example, although the illustrated embodiment is an RF glow discharge apparatus, the invention could be applied to other silicon vapor deposition devices where a silane gas is decomposed so as to deposit silicon on a substrate. Examples of alternative arrangements include chemical vapor deposition, and RF plasma sputtering.

What is claimed is:

1. In a method of depositing silicon of the type wherein gaseous silane is decomposed in a chamber to the decomposition products silicon and SiH which are deposited on a substrate, wherein said chamber contains impurities other than the silane compound and decomposition products, the improvement comprising:

ionizing at least one of said impurities in said chamber to form impurity ions;

collecting said impurity ions so as to prevent said impurity ions from being deposited on the substrate.

2. A method as recited in claim 1, wherein said ionizing step comprises passing a beam of electromagnetic radiation into said chamber, the radiation being of a wavelength which photoionizes said at least one impurity.

3. A method as recited in claim 2, wherein said impurity ions are collected by electrodes in said chamber, said electrodes having a DC electrical voltage applied thereto.

4. A method as recited in claim 3, wherein said radiation has a wavelength in the range of about 110 nm to about 180 nm.

5. A method as recited in claim 4, wherein said deposition method is of the glow discharge type which includes applying an alternating current to third and fourth electrodes within said chamber.

6. A method as recited in claim 7, wherein said collecting step comprises generating an electric field for attracting impurity ions to an electrode.

* * * * *

UNITED STATES PATENT AND TRADEMARK OFFICE
CERTIFICATE OF CORRECTION

PATENT NO. : 4,664,938

DATED : 5/12/87

INVENTOR(S) : Starnes E. Walker

It is certified that error appears in the above-identified patent and that said Letters Patent is hereby corrected as shown below:

Column 8, claim 6, line 10, "7" should read ---1---.

Signed and Sealed this

Twentieth Day of October, 1987

Attest:

DONALD J. QUIGG

Attesting Officer

Commissioner of Patents and Trademarks